(12) United States Patent
Park et al.

(10) Patent No.: US 10,914,445 B2
(45) Date of Patent: Feb. 9, 2021

(54) VEHICLE LAMP USING SEMICONDUCTOR LIGHT EMITTING DEVICE

(71) Applicant: LG ELECTRONICS INC., Seoul (KR)

(72) Inventors: Sechul Park, Seoul (KR); Mingu Kang, Seoul (KR); Hooyoung Song, Seoul (KR); Sungwhan Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 315 days.

(21) Appl. No.: 15/498,871

(22) Filed: Apr. 27, 2017

(65) Prior Publication Data

US 2018/0312102 A1    Nov. 1, 2018

(51) Int. Cl.
| | |
|---|---|
| *F21S 43/14* | (2018.01) |
| *F21S 43/50* | (2018.01) |
| *F21S 43/19* | (2018.01) |
| *H01L 23/28* | (2006.01) |
| *F21S 45/47* | (2018.01) |
| *F21S 43/15* | (2018.01) |
| *F21S 43/30* | (2018.01) |
| *F21S 43/16* | (2018.01) |
| *B60Q 1/26* | (2006.01) |
| *H01L 33/62* | (2010.01) |
| *H01L 25/075* | (2006.01) |
| *B60Q 1/00* | (2006.01) |

(52) U.S. Cl.
CPC .............. *F21S 43/14* (2018.01); *F21S 43/15* (2018.01); *F21S 43/16* (2018.01); *F21S 43/195* (2018.01); *F21S 43/30* (2018.01); *F21S 43/50* (2018.01); *F21S 45/47* (2018.01); *H01L 23/28* (2013.01); *B60Q 1/0041* (2013.01); *B60Q 1/2696* (2013.01); *H01L 25/0753* (2013.01); *H01L 33/62* (2013.01)

(58) Field of Classification Search
CPC .......................... B60Q 1/0041; H01L 25/0753
See application file for complete search history.

(56) References Cited

U.S. PATENT DOCUMENTS

| | | | | |
|---|---|---|---|---|
| 2002/0113246 | A1* | 8/2002 | Nagai ...................... | F21K 9/90 257/99 |
| 2008/0170396 | A1* | 7/2008 | Yuan ........................ | F21K 9/00 362/244 |
| 2010/0118532 | A1* | 5/2010 | Liang ...................... | F21S 2/005 362/235 |

\* cited by examiner

*Primary Examiner* — Diane I Lee
*Assistant Examiner* — Zachary J Snyder
(74) *Attorney, Agent, or Firm* — Birch, Stewart, Kolasch & Birch, LLP

(57) ABSTRACT

A vehicle lamp including a base portion; and a plurality of light source modules arranged on one surface of the base portion. Further, each of the light source modules includes a plurality of semiconductor light emitting devices, and a plurality of electrodes electrically connected to the semiconductor light emitting devices. At least first side included in the light source modules faces a second side of a neighboring light source module, and the plurality of electrodes are arranged on sides facing to each other, respectively, such that the light source modules are electrically connected to each other.

16 Claims, 9 Drawing Sheets

VEHICLE LAMP USING SEMICONDUCTOR LIGHT EMITTING DEVICE

BACKGROUND OF THE INVENTION

1. Field of the Invention

The present invention relates to a vehicle lamp (or car lamp), and more particularly, a vehicle lamp using a semiconductor light emitting device.

2. Description of the Conventional Art

A vehicle is equipped with various lamps having lighting functions and signaling functions. In general, halogen lamps or gas discharge lamps are usually used, but in recent years, light emitting diodes (LEDs) are in the spotlight as light sources for vehicle lamps.

The LED can enhance a degree of freedom for design of a lamp by minimizing a size thereof and exhibit economic efficiency by virtue of a semi-permanent lifespan, but most of the LEDs are currently produced in a form of a package. The LED itself other than the package is under development as a semiconductor light emitting device of converting a current into light, namely, an image displaying light source equipped in an electronic device such as an information communication device.

Vehicle lamps using the LEDs in the package form have disadvantages such as a low mass production yield rate, high fabrication costs and low flexibility. Therefore, attempts to apply a surface light source using the semiconductor light emitting device itself other than the package type to the vehicle lamp are currently undergoing. However, the surface light source using the semiconductor light emitting device itself has difficulty in implementing a large area as light sources. Thus, the present invention proposes a new mechanism capable of facilitating an implementation of a large surface light source.

SUMMARY OF THE INVENTION

The present invention has been made in an effort to solve the aforementioned problems, and an aspect of the present invention is to provide a vehicle lamp capable of implementing a large surface light source using a semiconductor light emitting device.

Another aspect of the detailed description is to provide a surface light source capable of deriving various designs of vehicle lamps.

Another aspect of the detailed description is to provide a vehicle lamp capable of facilitating an arrangement of light sources.

A vehicle lamp according to the present invention to achieve those aspects may be configured such that unit surface light sources are tiled, so as to implement a large light source.

In detail, a vehicle lamp according to the present invention may include a base portion, and a plurality of light source modules arranged on one surface of the base portion. Each of the plurality of light source modules may include a plurality of semiconductor light emitting devices, and a plurality of electrodes electrically connected to the semiconductor light emitting devices. At least first side included in the light source modules may be arranged to face a second side of a neighboring light source module. The plurality of electrodes may be arranged on the first and second sides facing each other such that the light source modules can be electrically connected together.

One exemplary embodiment of the present invention provides a display device including: semiconductor light-emitting diodes; a plurality of scan lines that are configured to transmit a scan driving signal to the semiconductor light-emitting diodes and located parallel to each other; a plurality of data lines that intersect the scan lines so as to transmit a data driving signal to the semiconductor light-emitting diodes; and a first driver and a second driver that are connected to the scan lines and the data lines and provide the scan driving signal and the data driving signal, wherein at least one of the scan lines may be connected to either the first driver or the second driver, and some of the data lines intersecting the at least one scan line may be connected to the first driver and the others may be connected to the second driver.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings:

FIG. 1B is an enlarged view illustrating a state that the rear lamp of FIG. 1A is turned on;

DETAILED DESCRIPTION OF THE INVENTION

Figure 1A:
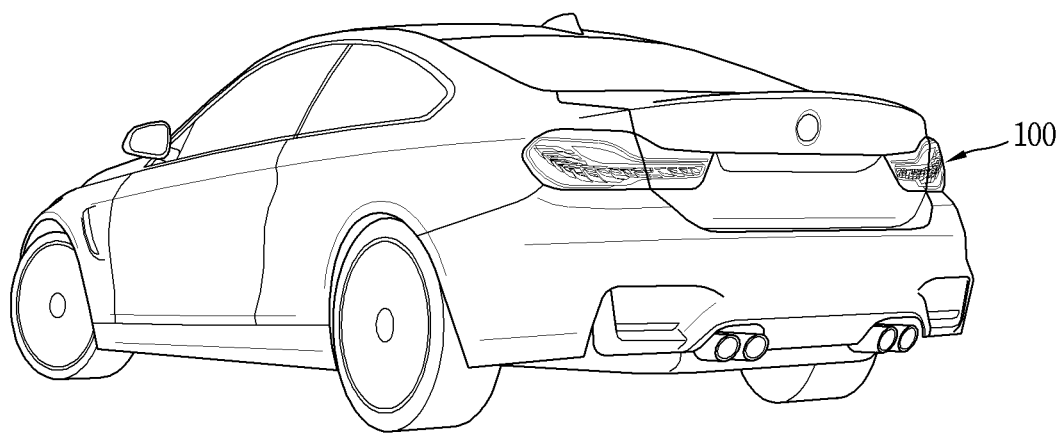
FIG. 1A is a conceptual view illustrating a rear lamp as one embodiment of a vehicle lamp.

Hereinafter, the embodiments disclosed herein will be described in detail with reference to the accompanying drawings, and the same or similar elements are designated with the same numeral references regardless of the numerals in the drawings and their redundant description will be omitted. A suffix "module" or "unit" used for constituent elements disclosed in the following description is merely intended for easy description of the specification, and the suffix itself does not give any special meaning or function. In describing the embodiments disclosed herein, moreover, the detailed description will be omitted when a specific description for publicly known technologies to which the invention pertains is judged to obscure the gist of the present invention.

Also, the accompanying drawings are merely illustrated to easily explain the concept of the invention, and therefore, they should not be construed to limit the technological concept disclosed herein by the accompanying drawings. Furthermore, when an element such as a layer, region or substrate is referred to as being "on" another element, it can be directly on the other element or an intermediate element may also be interposed therebetween.

A vehicle lamp described in this specification may include a head lamp, a tail lamp, a position lamp, a fog lamp, a turn signal lamp, a brake lamp, an emergency lamp, a backup lamp, and the like. However, it will be readily apparent to those skilled in the art that the configuration according to the embodiments described herein may also be applied to a new product type that will be developed later if the device is a device capable of emitting light.

Figure 1B:
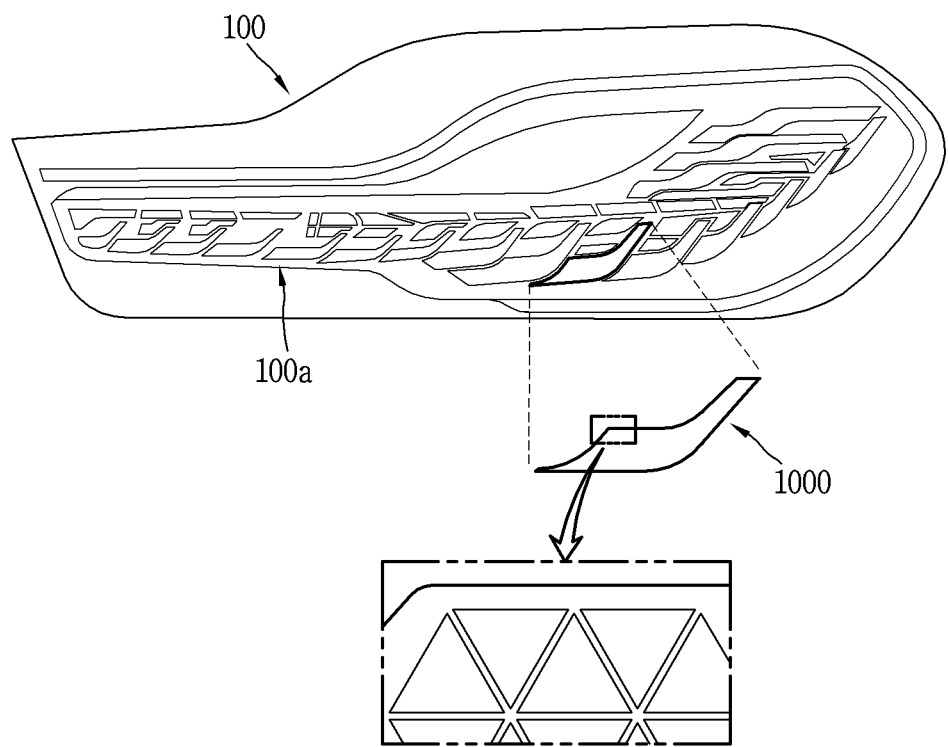

FIG. 1A is a conceptual view illustrating a rear lamp as one embodiment of a vehicle lamp, and FIG. 1B is an enlarged view illustrating a state in which the rear lamp of FIG. 1A is turned on.

Referring to FIG. 1A, a rear lamp 100 of a vehicle is disposed on each of both sides of a rear surface of the vehicle, thereby forming rear appearance of the vehicle.

The rear lamp 100 may be a lamp in which a tail lamp, a turn signal lamp, a brake lamp, an emergency lamp, and a backup lamp are combined in a package form. That is, the rear lamp 100 includes a plurality of lamps selectively emitting light according to the control of the vehicle.

In this instance, at least one of the plurality of lamps may be configured to emit light in a preset shape. As one example, a brake lamp 100a may be formed long in a horizontal direction and have at least part curved in a vertical direction, such that light is emitted in a shape corresponding to the shape of the brake lamp 100a. In addition, the brake lamp 100a may be bent toward the front of the vehicle. Such three-dimensional complex shape may be realized by a plurality of light emitting regions.

Referring to FIG. 1B, the preset shape is realized by combining light emitting regions with different shapes.

A light source unit 1000 implemented by a semiconductor light emitting device may be disposed on the light emitting region. The light source unit 1000 may be fixed to a vehicle body through a frame, and a wiring line for supplying power to the light source unit 1000 may be connected to the frame.

The light source unit may be a flexible light source unit that can be curved, bent, twisted, folded or rolled by an external force. The light source unit may also be a surface light source having a light emitting surface corresponding to the light emitting region.

In this instance, the light source unit 1000 may be provided in plurality to be arranged on the light emitting regions, respectively, or be configured as a single light emitting unit so as to realize the entire preset shape.

A pixel of the light source unit 1000 may be implemented by a semiconductor light emitting device. In the present invention, a light emitting diode (LED) is exemplarily employed as one type of semiconductor light emitting device for converting a current into light. The LED may be a light emitting device having a size ranging from several to several tens of micrometers, and may serve as a pixel on the three-dimensional space.

Meanwhile, the light source unit according to the present invention is configured so that light source modules are tiled, thereby realizing a light source with a large area. Hereinafter, light source units formed to be tiled will be described in more detail.

Figure 2:
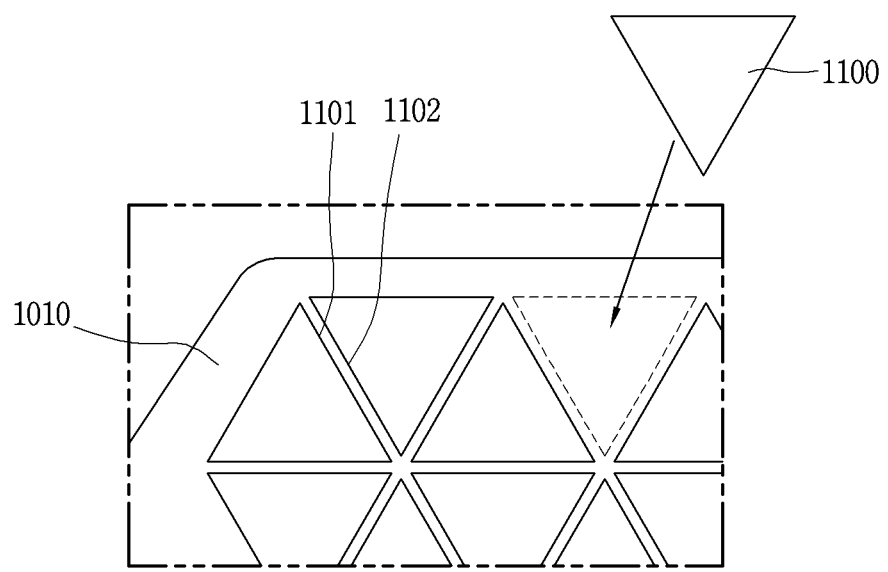
FIG. 2 is a conceptual view illustrating a basic concept of tiling light source modules.
Figure 3:
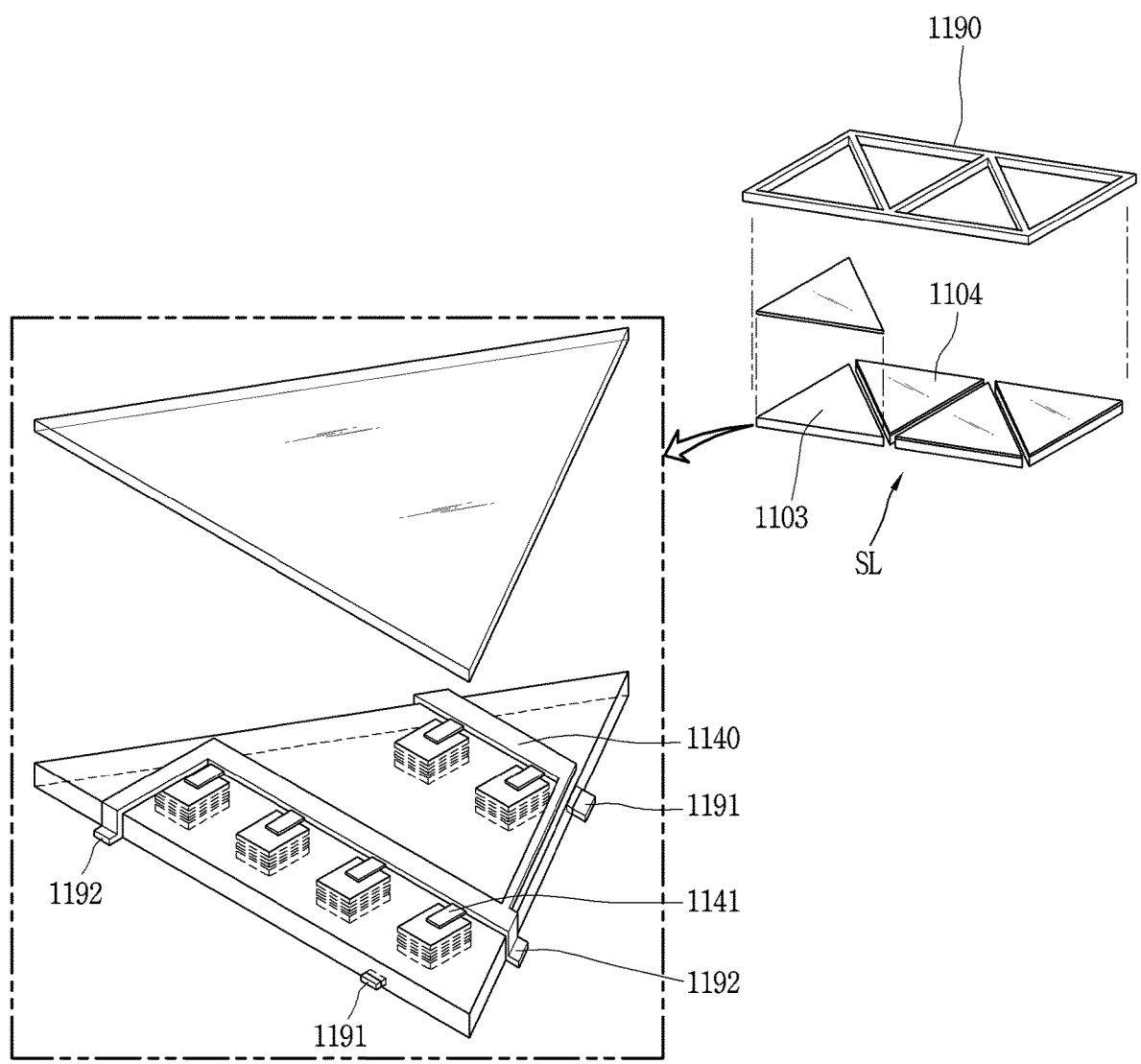
FIG. 3 is a perspective view of a light source unit in accordance with one embodiment of the present invention.
Figure 4:
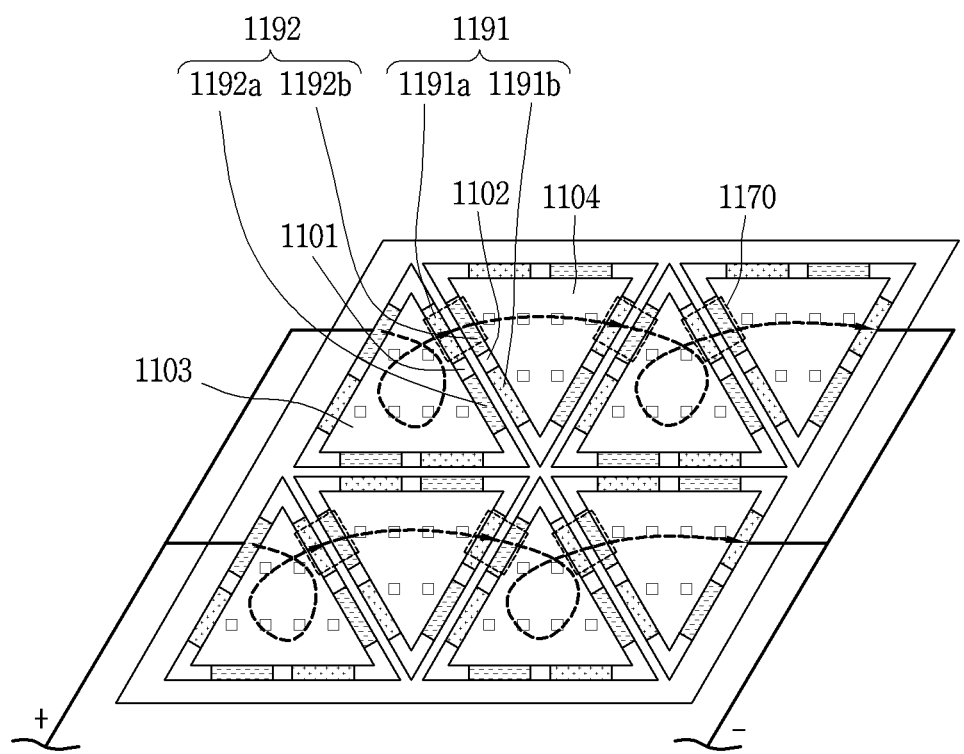
FIG. 4 is a planar view of the light source unit of FIG. 3.
Figure 5:
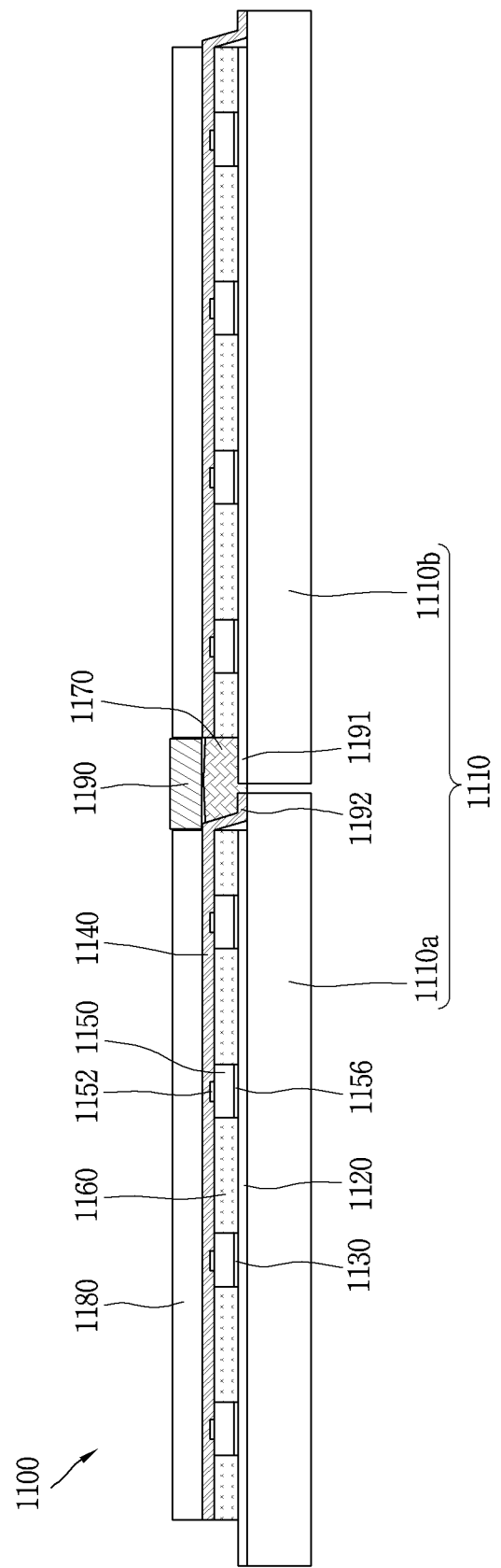
FIG. 5 is a cross-sectional view of the light source unit of FIG. 3.
Figure 6:
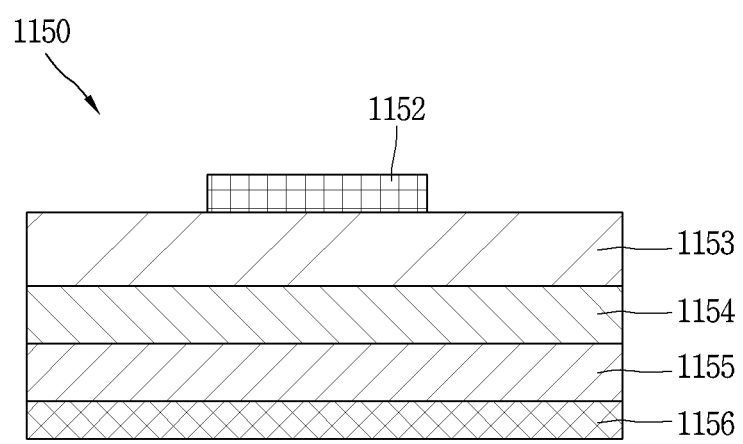
FIG. 6 is a conceptual view illustrating a vertical semiconductor light source unit of FIG. 3.

FIG. 2 is a conceptual view illustrating a basic concept of tiling light source modules, FIG. 3 is a perspective view of a light source unit according to one embodiment of the present invention, FIG. 4 is a planar view of the light source unit of FIG. 3, FIG. 5 is a cross-sectional view of the light source unit of FIG. 3, and FIG. 6 is a conceptual view illustrating a vertical semiconductor light source unit of FIG. 3.

Referring to FIG. 2, a light source unit 1000 includes a base portion 1010 and a plurality of light source modules 1100.

The base portion 1010 is a substrate on which the plurality of light source modules 1100 are attached, and may be a base layer whose structure is formed through an entire process. In this instance, the base portion 1010 may include a reflective film for reflecting light. The reflective film reflects light emitted from the light source modules 1100, and thus the base portion 1010 may be a reflector of a lamp. In order to realize a three-dimensional shape of a rear lamp, the base portion 1010 may be formed in a shape with at least part curved (or bent).

The base portion 1010 may contain glass or polyimide (PI) to implement a flexible light source unit. Further, the base portion 1010 may be a thin metal.

The plurality of light source modules 1100 are arranged on one surface of the base portion 1010. In this instance, a heat dissipation sheet, a heat sink, or the like is mounted on the base portion 1010, and a heat dissipation function can be realized accordingly. In this case, the heat dissipation sheet, the heat sink, or the like may be mounted on an opposite surface of the one surface on which the plurality of light source modules 1100 are disposed.

The plurality of light source modules 1100 may be formed in a polygonal shape and continuously attached on the surface of the base portion 1010. The plurality of light source modules 1100 may have various shapes such as a quadrangle, a triangle, a hexagon and the like. This embodiment exemplarily illustrates a triangular light source module in consideration of design freedom. As such, since triangular unit light source modules 1100 are arranged on the surface of the base portion 1010, a surface light source (or planar light source) in desired size and shape can be realized.

In this instance, at least first side 1101 of each light source module 1100 may be disposed to face a second side 1102 of a neighboring light source module. For example, the light source modules 1100 may be arranged so that triangles and inverted triangles are repeated along one direction. More specifically, the light source modules 1100 may form a parallelogram in a manner that the triangles and the inverted triangles are sequentially arranged in a row direction. The arrangement pattern of the light source modules 1100 may be varied into various forms, which will be described later.

Referring to FIGS. 3 to 5, each of the light source modules 1100 includes a wiring board 1110, a first wiring 1120, an adhesive layer 1130, a second wiring 1140, and a plurality of semiconductor light emitting devices 1150.

The wiring board 1110 may be a flexible board. For example, the wiring board 1110 may contain glass or polyimide (PI) to realize a flexible light source unit. In addition, the wiring board 1100 may be made of any material such as polyethylene naphthalate (PEN) or polyethylene terephthalate (PET) if the material has an insulating property and flexibility. Also, the wiring board 1110 may be made of any of a transparent material or an opaque material.

The first wiring 1120 may be located on the wiring board 1110 and formed as a planar electrode. The first wiring 1120 may be an electrode layer disposed on the wiring board 1110, and serve as a data electrode. As another example, the first wiring 1120 may be formed as a bar-shaped electrode long in one direction.

The first wiring 1120 in the planar shape may be a common electrode surface and covers the plurality of semiconductor light emitting devices 1150 such that light can be reflected between the plurality of semiconductor light emitting devices 1150. Accordingly, a structure of a highly-reflective electrode layer can be realized, thereby enhancing light efficiency. The common electrode surface may overlap 10 to 100,000 semiconductor light emitting devices, and the semiconductor light emitting devices 1150 cover the common electrode surface in an array form.

As another example, the first wiring may be provided separately, and the wiring board may be a board without a wiring.

The adhesive layer 1130 may be a layer having adhesiveness and conductivity. To this end, the adhesive layer 1130 may be configured by mixing a material having conductivity and a material having adhesiveness. The adhesive layer 1130 also has flexibility, thereby enabling a flexible function in a display device.

As an example, the adhesive layer 1130 may be an anisotropic conductive film (ACF), an anisotropic conductive paste, a solution containing conductive particles, or the like. The adhesive layer 1130 may be formed as a layer which allows an electrical interconnection in a Z direction penetrating through thickness but has an electrical insulating property in a horizontal X-Y direction. Accordingly, the adhesive layer 1130 may be referred to as a Z-axial conductive layer.

The anisotropic conductive film is a film in which an anisotropic conductive medium is mixed with an insulating base member. When heat and pressure are applied, only a specific portion of the anisotropic conductive film has conductivity due to the anisotropic conductive medium. Hereinafter, description will be given of an example in which heat and pressure are applied to the anisotropic conductive film, but other methods may be used to allow the anisotropic conductive film to partially have conductivity. Examples of these methods may be a method of applying one of the heat and the pressure, UV curing, and the like.

In addition, since the anisotropic conductive film contains an adhesive component, the adhesive layer 1130 realizes not only an electrical connection but also mechanical bonding between the semiconductor light emitting device 1150 and the first wiring 1120.

In this instance, the anisotropic conductive medium may be, for example, conductive balls or conductive particles. In this example, the anisotropic conductive film is a film in which conductive balls are mixed with an insulating base member. When heat and pressure are applied, only a specific portion of the anisotropic conductive film has conductivity by the conductive balls. The anisotropic conductive film may be in a state in which a plurality of particles coated with an insulating film made of a polymer material are contained in a conductive core. In this instance, the insulating film on the heat and pressure-applied portion is broken and thus the anisotropic conductive film has the conductivity due to the core. In this instance, a shape of the core may be deformed to form layers brought into contact with each other in a thickness direction of the film. As a more specific example, heat and pressure are applied to the full anisotropic conductive film, and the electrical connection in the Z-axial direction is partially formed by a height difference of a member adhered by the anisotropic conductive film.

As another example, the adhesive layer 1130 may be a portion that is soldered by a solder material. The solder material may be at least one of, for example, Sb, Pd, Ag, Au and Bi. In this instance, the solder material is coated on the first wiring 1120 of the wiring board, and soldering may be performed using thermal energy. As another method, the solder material may be coated on the semiconductor light emitting device, and soldering may be performed using thermal energy.

As such, the semiconductor light emitting device 1150 is connected to the first wiring 1120 through the adhesive layer 1130 and constitutes an individual pixel in the light source module 1100. The semiconductor light emitting device 1150 even in a small size can constitute an individual unit pixel by virtue of its excellent brightness. The size of the individual semiconductor light emitting device 1150 may be 80 μm or less on one side and may be a rectangular or square device. In the case of having the rectangular shape, the size of the individual semiconductor light emitting device 1150 may be 20×80 μm or less.

As illustrated, the semiconductor light emitting device 1150 may have a vertical structure. However, the present invention is not limited thereto, and the semiconductor light emitting device may alternatively be a flip chip type light emitting device.

A plurality of second wirings 1140, which are long in a line shape in one direction and electrically connected to the vertical semiconductor light emitting devices 1150, are arranged between the vertical semiconductor light emitting devices.

Referring to FIG. 6, the vertical semiconductor light emitting device includes a p-type electrode 1156, a p-type semiconductor layer 1155 disposed on the p-type electrode 1156, an active layer 1154 disposed on the p-type semiconductor layer 1155, an n-type semiconductor layer 1153 disposed on the active layer 1154, and an n-type electrode 1152 disposed on the n-type semiconductor layer 1153. In this instance, the p-type electrode 1156 located at the bottom may be electrically connected to the first wiring 1120 by the adhesive layer 1130, and the n-type electrode 1152 located at the top may be electrically connected to the second wiring 1140. The vertical type semiconductor light emitting device 1150 may have the electrodes arranged at the top and bottom, so as to have a great advantage of reducing a chip size.

The n-type electrode 1152 and the p-type electrode 1156 may be formed by a deposition method such as sputtering, but the present invention is not limited thereto. In this instance, the n-type electrode 1152 may be a second conductive electrode, and the p-type electrode 1156 may be a first conductive electrode. The p-type semiconductor layer may be a first conductive semiconductor layer, and the n-type semiconductor layer may be a second conductive semiconductor layer.

According to another embodiment of the present invention, impurities may be injected into an intrinsic or doped semiconductor substrate to form the first and second conductive semiconductor layers. In addition, a region where a p-n junction is formed by the impurity injection may serve as the active layer. Therefore, the following description of the p-type semiconductor layer, the n-type semiconductor layer and the active layer is merely exemplary but the present invention is not limited thereto.

Referring back to FIGS. 3 to 5, the second wiring 1140 is located between the semiconductor light emitting devices 1150 and is electrically connected to the semiconductor light emitting devices 1150. For example, the semiconductor light emitting devices 1150 may be arranged in a plurality of rows, and the second wiring 1140 may be located between the rows of the semiconductor light emitting devices 1150.

In this instance, since the semiconductor light emitting devices 1150 constituting the individual pixels have a sufficient distance therebetween, the second wiring 1140 may be located between the semiconductor light emitting devices 1150. In addition, the second wiring 1140 may be formed as a bar-shaped electrode long in one direction.

As illustrated, the second wiring 1140 and the semiconductor light emitting devices 1150 may be electrically connected by connection electrodes 1141 protruding from the second wiring 1140. In this instance, each connection electrode 1141 itself may be the n-type electrode 1152 of the semiconductor light emitting device 1150. For example, the n-type electrode 1152 is formed as an ohmic electrode for an ohmic contact, and the second wiring 1140 covers at least a part of the ohmic electrode in a printing manner or a deposition manner. Accordingly, the second wiring 1140 and the n-type electrode 1152 of the semiconductor light emitting device 1150 can be electrically connected to each other.

Meanwhile, the plurality of semiconductor light emitting devices 1150 included in the light source module 1100 are connected in parallel in the light source module.

For example, the plurality of semiconductor light emitting devices 1150 are connected in parallel by the first wiring 1120 and the second wiring 1140. Specifically, one of the p-type electrode and the n-type electrode included in each of the plurality of semiconductor light emitting devices is connected to the first wiring 1120, and the other of the p-type electrode and the n-type electrode is connected to the second wiring 1140. That is, the plurality of light emitting devices are connected in parallel so as to have the first wiring 1120 and the second wiring 1140 as common electrodes, respectively. Accordingly, a loss of function of the entire system due to an electrical disconnection in the light source module 1100 can be prevented, and a uniform current distribution can be obtained.

The plurality of semiconductor light emitting devices 1150 also construct a light emitting device array, and an insulating layer 1160 is interposed between the plurality of semiconductor light emitting devices 1150. For example, the insulating layer 1160 is formed on one surface of the adhesive layer 1130 to fill a space between the neighboring semiconductor light emitting devices 1150.

As illustrated, the second wiring 1140 may be located on the insulating layer 1160. However, the present invention is not necessarily limited thereto. When the adhesive layer 1130 fills the space between the semiconductor light emitting devices without the insulating layer 1160, the second wiring 1140 may be located on the adhesive layer 1130.

The insulating layer 1160 may be a transparent insulating layer containing silicon oxide (SiOx) or the like. As another example, the insulating layer 1160 may be formed of a polymer material such as epoxy, methyl, or phenyl-based silicone having a good insulating property and less light absorption, or an inorganic material such as SiN or Al2O3, to construct a structure for preventing electrodes from being shorted from each other.

Meanwhile, a phosphor layer 1180 may be provided on one surface of the semiconductor light emitting device 1150. For example, the semiconductor light emitting device 1150 is a blue semiconductor light emitting device that emits blue (B) light, and a phosphor layer 1180 for converting the blue light into a color of a unit pixel may be provided. In this instance, the phosphor layer 1180 may be a red phosphor that converts blue to red.

As another example, the semiconductor light emitting device 1150 may be a semiconductor light emitting device that emits blue or green light, and the phosphor layer 1180 may be a yellow phosphor that converts blue or green to white. In this instance, the plurality of semiconductor light emitting devices may be realized as high-output light emitting devices which further contain indium (In) and/or aluminum (Al) together with gallium nitride (GaN) and emit light. As one example, the plurality of semiconductor light emitting devices may be gallium nitride thin films formed into various layers such as n-Gan, p-Gan, AlGaN, and InGan.

In this instance, a wavelength of light formed in a nitride-based semiconductor light emitting device is in the range of 390 to 550 nm and may be converted into 450 to 670 nm through a phosphor-inserted film. Further, all of the red phosphor and the green phosphor may be provided such that light of various wavelengths can be mixed to realize white light.

However, the present invention is not limited thereto. The semiconductor light emitting device 1150 may be a red semiconductor light emitting device that emits red (R) light, and the phosphor layer 1180 may be replaced with an encapsulating material.

In this instance, a GaAs-based red semiconductor light emitting device may be used, and an encapsulating layer covering an upper surface of the wiring board 1110 in the light source module 1100 may be provided.

The encapsulating layer is coated on the upper surface of the wiring board 1110 so as to cover the semiconductor light emitting devices 1150 to protect the semiconductor light emitting devices 1150 provided on the wiring board 1110. The encapsulating layer may be made of a thermosetting and/or photocurable resin. The encapsulating layer may be coated on the upper surface of the wiring board 1110 in a liquid state, and then cured by a curing process using heat and/or light.

As another example, a light diffusion film may be used as the encapsulating layer. Further, a scattering agent or the like may be added to the encapsulating layer to improve light extraction efficiency.

Meanwhile, as illustrated, each of the light source modules includes a plurality of electrodes 1191 and 1192 electrically connected to the semiconductor light emitting devices.

In this instance, as described above, when the light source modules 1100 are attached on the one surface of the base portion 1010, at least one side included in the light source modules 1100 faces one side of the neighboring light source module.

As illustrated, the plurality of electrodes 1191 and 1192 are disposed on the first and second sides 1101 and 1102 facing each other so that the light source modules 1100 are electrically connected. For example, a pair of electrodes 1191a, 1192a or 1191b, 1192b are disposed on the respective sides of the light source modules 1100, and the pair of electrodes 1191a, 1192a or 1191b, 1192b may be connected to the p-type electrode and the n-type electrode of the plurality of semiconductor light emitting devices, respectively.

More specifically, the plurality of electrodes include a first electrode 1191 connected to the p-type electrodes of the plurality of semiconductor light emitting devices, and a second electrode 1192 connected to the n-type electrodes of the plurality of semiconductor light emitting devices. More specifically, the first electrode 1191 is electrically connected to the first wiring 1120, and the second electrode 1192 is electrically connected to the second wiring 1140. However, this connection relationship is illustrative, and the present invention is not necessarily limited thereto. For example, the p-type electrode may be connected to the second wiring and the second electrode, and the n-type electrode may be connected to the first wiring and the first electrode.

The plurality of semiconductor light emitting devices are connected in parallel to the first wiring 1120 and the second wiring 1140 so that the first electrode 1191 and the second electrode 1192 are electrically connected in parallel to the plurality of semiconductor light emitting devices. Specifically, each of the light source modules 1100 includes the polygonal wiring board 1010, and the plurality of semiconductor light emitting devices are connected to the wiring board 1010 in parallel.

In this instance, the light source modules 1100 include a first light source module 1103 and a second light source module 1104 which are neighboring to each other. The electrodes 1191a and 1192a disposed on one side of the first light source module 1103 may face the electrodes 1191b and 1192b disposed on one side of the second light source module 1104. Accordingly, the light source modules 1100 are connected in series with the neighboring light source modules, respectively.

The first electrode 1191 and the second electrode 1192 may be disposed on each side of the first light source module 1103 and the second light source module 1104. As such, the electrical anode and cathode are provided on each side of the light source module, and thus the light source modules can be connected in series so as to constitute a series-connection unit assembly.

According to the drawing, by the serially-connected light source modules 1100, sub light source units SL form a series-connection unit assembly. The sub light source units SL may be connected in parallel on the one surface of the base portion 1010, respectively. For this, wirings may be provided on one surface of the base portion 1010. In this example, four light source modules 1100 are arranged along one direction to form a parallelogram. The four light source modules 1100 are connected in series to form one sub light source unit SL.

In addition, the sub light source units SL are arranged along another direction intersecting with the one direction, thereby forming one light source unit. Thus, a large light emitting surface can be realized with a high degree of design freedom.

The first electrode 1191 and the second electrode 1192 are sequentially disposed along edges (sides) included in the light source modules 1100 for the serial connection of the light source modules 1100. Accordingly, the electrodes are arranged to have opposite polarities at the sides facing each other. For example, for the triangular light source module 1100, a first side, a second side and a third side are sequentially connected, and the first electrode 1191 and the second electrode 1192 may be sequentially arranged on each of the sides along a direction of continuously surrounding the sides. In this instance, as illustrated in this example, when the triangle and the inverted triangle are continuously arranged, the electrodes of the triangular light source module 1100 have different polarities from the electrodes of the inverted-triangular light source module 1100.

More specifically, the wiring board 1110 may be formed to have three sides, and the light source modules 1100 may be arranged such that triangles and inverted triangles are repeated along one direction. The first electrode 1191 and the second electrode 1192 are sequentially disposed on each side of the wiring board so that the triangular wiring board 1110a and the inverted-triangular wiring board 1110b can be connected in series.

As illustrated, the first light source module 1103 and the second light source module 1104 may be electrically connected to each other by a conductive connection portion 1170 which is formed of a conductive material and covers the electrodes facing each other.

The conductive connection portion 1170 may be disposed between two adjacent light source modules in the sub light source unit SL. In this instance, the conductive connection portion is configured to cover the first electrode 1191a of the first light source module 1103 and the second electrode 1192b of the second light source module 1104 or to cover the second electrode 1192a of the first light source module 1103 and the first electrode 1191b of the second light source module 1104. However, the present invention is not limited thereto. The conductive connection portion 1170 may also be provided as a pair with a first connection portion that covers the first electrode 1191a of the first light source module 1103 and the second electrode 1192b of the second light source module 1104, and a second connection portion that covers the second electrode 1192a of the first light source module 1103 and the first electrode 1191b of the second light source module 1104. The conductive connection portion 1170 may be formed through a process such as printing, deposition, plating, and the like.

More specifically, the first electrode 1191 and the second electrode 1192 of the light source module 1100 may be disposed on one surface of the wiring board. In this instance, unlike the illustrated example, the first electrode 1191 and the second electrode 1192 may have a height difference with respect to the wiring board. In this instance, the first electrode connected to the first wiring 1120 may be formed at a position farther from the wiring board than the second electrode.

The first wiring 1120 connected to the p-type electrode of the semiconductor light emitting device is configured as a lower wiring, the second wiring 1140 connected to the n-type electrode is configured as an upper wiring, and the second wiring 1140 extends to one surface of the wiring board.

The conductive connection portion 1170 is printed, deposited or plated on the first electrode 1191 and the second electrode 1192, which can facilitate the first light source module 1103 and the second light source module 1104 to be electrically connected, in spite of the height difference.

In this instance, the conductive connection portion 1170 may be used as a bezel generated when assembling the unit surface light sources. Therefore, a protective layer for protecting the conductive connection portion 1170 may be provided. As an example of such a protective layer, a protective insulating layer 1190 may be formed to cover the conductive connection portion 1170. The protective insulating layer 1190 may be made of a polymer material, such as polyimide, silicon, or polyurethane, which is electrically insulated and has flexibility. The protective insulating layer 1190 may be formed by a method such as coating, printing, and laminating after forming the conductive connection portion 1170.

The protective insulating layer 1190 may extend along a gap formed between the light source modules 1100. Accordingly, the protective insulating layer 1190 may be formed along the sides of the triangle, and one side of the triangle may be a side of a neighboring inverted triangle.

In this instance, reflective particles or a scattering agent may be added into the protective insulating layer 1190. As an example, the protective insulating layer 1190 may include a polymer containing the reflective particles or the scattering agent to increase efficiency of the unit surface (planar) light source module. The reflective particles may be titanium oxide, alumina, magnesium oxide, antimony oxide, zirconium oxide, silica, white pigment or the like.

According to the structure of the light source unit of the present invention described above, the electrical anode and cathode may be provided on each side of each light source module, and thus the light source modules can be connected in series to constitute a series-connection unit assembly.

In addition, the series-connection unit assemblies may be arranged in parallel so as to implement a large surface light source in desired size and shape. The series-parallel mixed structure can allow the light source modules to be tiled to match a design.

Meanwhile, the series-connection unit assembly may be varied into various forms. Hereinafter, such variations will be described.

Figure 7:
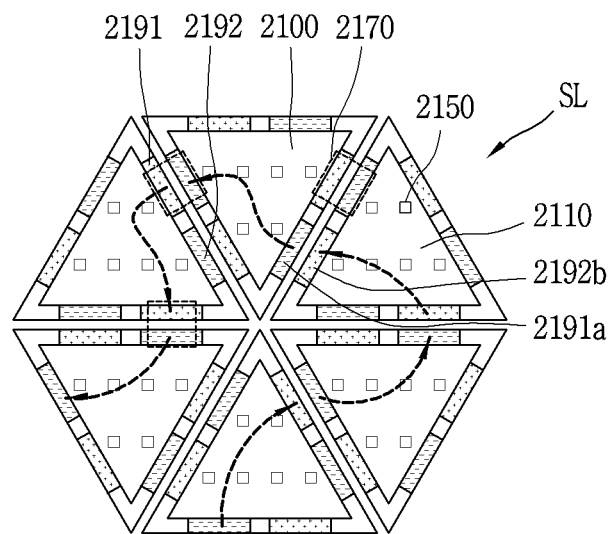
FIGS. 7 and 8 are conceptual views illustrating embodiments of a series-connection unit assembly according to the present invention.
Figure 8:
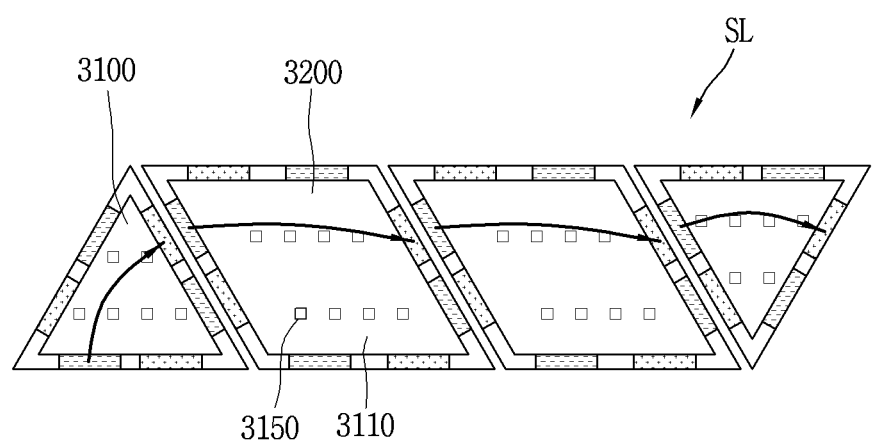

FIGS. 7 and 8 are conceptual views illustrating embodiments of a series-connection unit assembly according to the present invention.

Referring to FIG. 7, six light source modules 2100 may be connected in series to form one sub light source unit SL.

The plurality of light source modules 2100 may be formed in a triangular shape and continuously attached on a surface of a base portion (not illustrated). Three triangular unit light source modules may be arranged in two rows for each row.

In this instance, at least one side included in the light source modules 2100 may be disposed to face one side of the neighboring light source module. For example, the light source modules 2100 may be arranged so that triangles and inverted triangles are repeated in each row and column. More specifically, the triangles and the inverted triangles may be arranged sequentially along a clockwise direction, thereby forming a hexagonal sub light source unit SL.

In this instance, each of the light source modules 2100, similar to the example described with reference to FIGS. 2 to 5, includes a wiring board 2110, a first wiring (not illustrated), an adhesive layer (not illustrated), a second wiring (not illustrated) and a plurality of semiconductor light emitting devices 2150. The structure of the wiring board, the first wiring, the adhesive layer, the second wiring, and the plurality of semiconductor light emitting devices is the same as the structure of the above-described example, and thus description thereof will be omitted.

As illustrated, the plurality of electrodes are disposed on sides facing each other such that the light source modules 2100 are electrically connected. For example, a pair of electrodes 2191 and 2192 are disposed on each side included in the light source modules 2100. The pair of electrodes may be connected to the p-type electrode and the n-type electrode of the plurality of semiconductor light emitting devices, respectively.

More specifically, the plurality of electrodes may include a first electrode 2191 connected to the p-type electrodes of the plurality of semiconductor light emitting devices, and a second electrode 2192 connected to the n-type electrodes of the plurality of semiconductor light emitting devices. More specifically, the first electrode 2191 is electrically connected to the first wiring, and the second electrode 2192 is electrically connected to the second wiring.

The first electrode 2191 and the second electrode 2192 are arranged in opposite orders on the sides of the light source module in a clockwise direction. This may be implemented by sequentially arranging six of the same light source module to form triangles and inverted triangles along the clockwise direction.

Electrodes facing each other are connected in series by conductive connection portions 2170, respectively. The conductive connection portion 2170 may be disposed between adjacent two light source modules in the sub light source unit SL. In this instance, the conductive connection portion 2170 is formed to cover the first electrode 2191a of one of the two light source modules and the second electrode 2192b of the other. The conductive connection portion may be formed through a process such as printing, deposition, plating, or the like.

As described above, the electrical anode and cathode may be provided on each side of the light source module and thus the light source modules can be connected in series to configure a hexagonal series-connection unit assembly.

Meanwhile, as another example, referring to FIG. 8, light source modules 3100 and 3200 connected in series may be configured to have a plurality of shapes. As an example, the light source modules 3100 and 3200 may include a first light source module 3100 having a triangular shape and a second light source module 3200 having a parallelogram shape.

For example, the first light source modules 3100 may be disposed at edges of a sub light source unit SL, and the second light source modules 3200 may be disposed inside the sub light source unit SL. In this instance, each of the first light source module 3100 and the second light source module 3200, similar to the example illustrated with reference to FIGS. 2 to 6, includes a wiring substrate 3110, a first wiring, an adhesive layer, a second wiring, and a plurality of semiconductor light emitting devices 3150. The structure of the wiring board, the first wiring, the adhesive layer, the second wiring, and the plurality of semiconductor light emitting devices is the same as the structures of the above-described examples, and thus description thereof will be omitted.

In addition, the second light source module 3200 is formed in a manner that two of the light source modules of the example described with reference to FIGS. 2 to 6 form one parallelogram. Since the second light source module 3200 in the parallelogram shape is arranged inside the sub light source unit SL, the number of light source modules can be reduced. On the other hand, since the triangular first light source modules 3100 are disposed at the edges of the sub light source unit, a degree of freedom for design of the light source unit can be maintained.

Meanwhile, the present invention may employ a specific coupling structure in order to realize the above-described structure without the base portion. Hereinafter, the coupling structure will be described in more detail.

Figure 9:
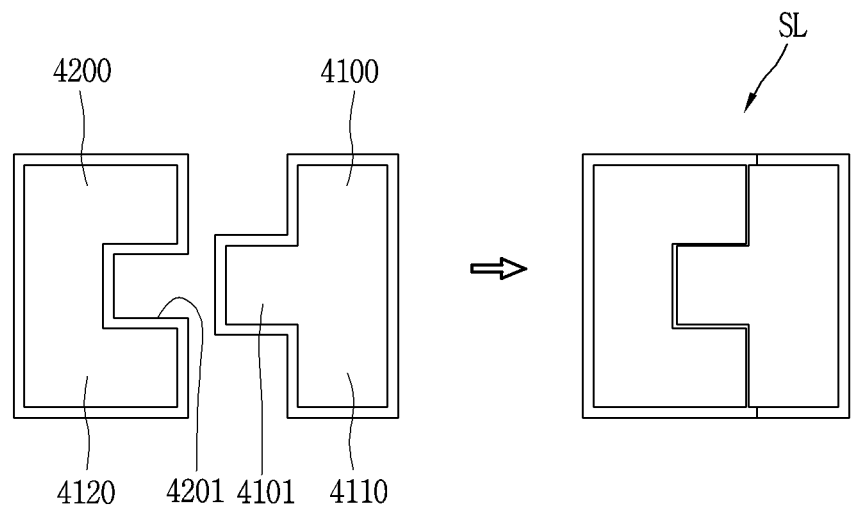
FIGS. 9 and 10 are conceptual views illustrating different embodiments of the present invention.
Figure 10:
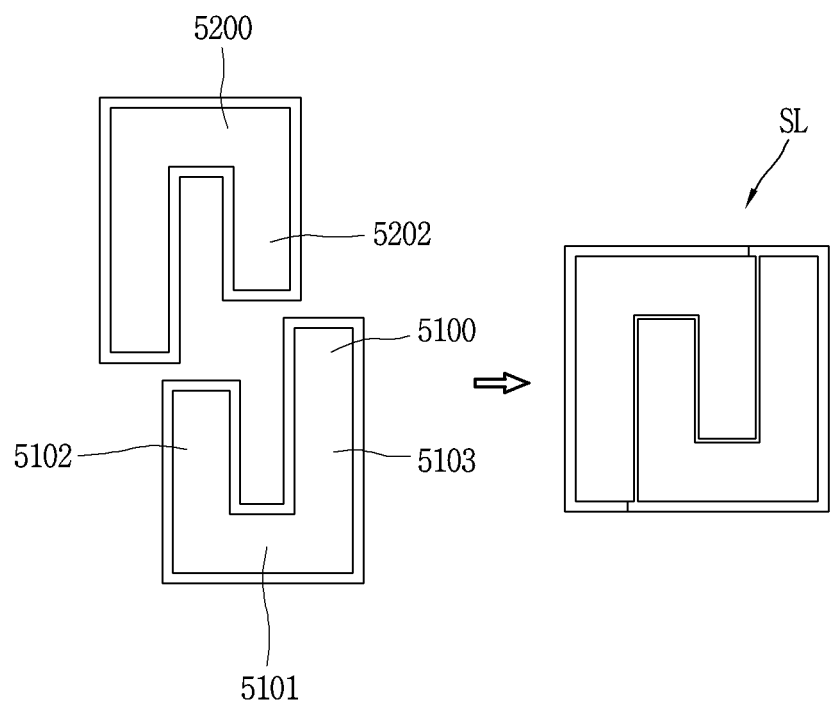

FIGS. 9 and 10 are conceptual views illustrating different embodiments of the present invention.

Referring to FIG. 9, a sub light source unit SL may include a pair of light source modules having different shapes. As an example, the pair of light source modules includes a first light source module 4100 and a second light source module 4200, which have shapes that one of the first light source module 4100 and the second light source module 4200 inserted into the other.

In this instance, each of the first light source module 4100 and the second light source module 4200, similar to the example illustrated with reference to FIGS. 2 to 5, includes a wiring substrate 4110, 4210, a first wiring, an adhesive layer, a second wiring, and a plurality of semiconductor light emitting devices. The structure of the first wiring, the adhesive layer, the second wiring, and the plurality of semiconductor light emitting devices are the same as those of the above-described examples, and thus description thereof will be omitted.

As illustrated, the sub light source unit forms a series-connection unit assembly by the serially-connected light source modules 4100 and 4200. In this instance, since the sub light source unit SL is not attached to the base portion but the light source modules 4100 and 4200 are coupled to each other in an inserting manner, the sub light source unit SL itself can be realized as a single product.

For example, the first light source module 4100 may include a protrusion 4101, and the second light source module 4200 may include a recess 4201 into which the protrusion 4101 is inserted. For example, the protrusion 4101 may be provided on the first wiring board 4110 of the first light source module 4100, and the recess 4102 may be formed on the second wiring board 4210 of the second light source module 4200.

More specifically, the first wiring board 4110 is provided with the protrude 4101 protruding from at least one side thereof, and the second wiring board 4210 is provided with the recess 4201 recessed into another side thereof facing the at least one side of the first wiring board 4110. As such, with the formation of a concavo-convex structure, the pair of light source modules can be coupled to each other without the base portion, thereby realizing the sub light source unit SL.

In addition, as illustrated, at least one side included in the light source modules 4100 may overlap one side of the neighboring light source module. By this overlap, the pair of light source modules can be coupled more rigidly.

For implementing the overlapped structure, the wiring board may be a flexible substrate. For example, the wiring board may contain polyimide (PI), polyethylene naphthalate (PEN), and polyethylene terephthalate (PET) to implement a flexible light source module.

As another example, referring to FIG. 10, a sub light source unit SL may include a pair of light source modules 5100 and 5200 having the same shape and coupled to each other in an inserting manner.

In this instance, each of the first light source module 5100 and the second light source module 5200, similar to the example described with reference to FIGS. 2 to 5, includes a wiring board, a first wiring, an adhesive layer, a second wiring, and a plurality of semiconductor light emitting devices. The structure of the first wiring, the adhesive layer, the second wiring, and the plurality of semiconductor light emitting devices is the same as those of the above-described examples, and thus description thereof will be omitted.

The pair of light source modules may include a first light source module 5100 and a second light source module 5200. The first light source module 5100 and the second light source module 5200 may have the same shape or have a structure to be inserted into (engaged with) each other. For example, each of the light source modules 5100 and 5200 may include a horizontal portion 5101 extending in a horizontal direction, and a first vertical portion 5102 and a second vertical portion 5103 extending respectively from both ends of the horizontal portion 5101 in a vertical direction. In this instance, the first vertical part 5102 and the second vertical portion 5103 may have different lengths.

With the structure, a first vertical portion 5202 of the second light source module 5200 is inserted between the first vertical portion 5101 and the second vertical portion 5102 of the first light source module 5100. Accordingly, the pair of light source modules can be coupled to each other without a base portion, thereby realizing the sub light source unit.

The vehicle lamp using the semiconductor light emitting device described in the aforesaid embodiments may not be limited to the configurations and methods of the foregoing embodiments, but many variations or modifications can be made by a selective combination of all or part of the embodiments.

A vehicle lamp according to the present invention can implement a surface light source in desired size and shape by use of light source modules. Also, a triangular light source module can be configured to improve a degree of freedom for design of a light emission shape of the vehicle lamp.

According to the present invention, each of the light source modules can be provided with electrical anode and cathode on each side thereof, and thus be connected in series to configure a series-connection unit assembly.

In addition, the series-connection unit assemblies may be arranged in parallel so as to implement a large surface light source in desired size and shape. This series-parallel mixed structure can allow the light source modules to be tiled to match a design.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A vehicle lamp, comprising:
a base portion; and
a plurality of light source modules arranged on one surface of the base portion, and including a first light source module and a second light source module neighboring each other,
wherein each of the plurality of light source modules comprises:
a plurality of semiconductor light emitting devices;
a plurality of electrodes electrically connected to the plurality of semiconductor light emitting devices; and
a phosphor layer provided on one surface of the plurality of semiconductor light emitting devices and converting a color of a unit pixel that the phosphor layer covers,
wherein at least a first side included in sides of the first light source module faces a second side included in sides of the second light source module, and
wherein the plurality of electrodes are arranged on the first and second sides facing each other, respectively, such that neighboring light source modules of the plurality of light source modules are electrically connected to each other,
wherein each of the plurality of light source modules further comprises:
a conductive connection portion made of a conductive material and covering the plurality of electrodes facing each other; and
a protective insulating layer formed to cover the conductive connection portion and to come into contact with sides included in the plurality of light source modules, and
wherein the protective insulating layer is extended along the sides of the light source modules in a gap between the plurality of light source modules and contains reflective particles or a scattering agent.

2. The vehicle lamp of claim 1, wherein the plurality of electrodes comprise a first electrode connected to p-type electrodes of the plurality of semiconductor light emitting devices, and a second electrode connected to n-type electrodes of the plurality of semiconductor light emitting devices.

3. The vehicle lamp of claim 2, wherein the first electrode and the second electrode are arranged on each side included in the plurality of light source modules.

4. The vehicle lamp of claim 3, wherein the first electrode and the second electrode are sequentially arranged along edges included in the plurality of light source modules.

5. The vehicle lamp of claim 1, wherein the plurality of semiconductor light emitting devices are connected in parallel to the plurality of electrodes.

6. The vehicle lamp of claim 5, wherein the plurality of electrodes are arranged to have opposite polarities to each other on the first and second sides facing each other such that the neighboring light source modules are connected to each other in series.

7. The vehicle lamp of claim 6, further comprising sub light source units connected in parallel to each other on one surface of the base portion,
wherein each of the sub light source units comprises the series-connected light source modules.

8. The vehicle lamp of claim 1, wherein each of the plurality of light source modules comprises a polygonal wiring board, and
wherein the plurality of semiconductor light source devices are connected in parallel on the wiring board.

9. The vehicle lamp of claim 8, wherein the wiring board has three sides, and the plurality of light source modules are arranged in a manner that triangles and inverted triangles are repeated along one direction.

10. The vehicle lamp of claim 1, wherein the first light source module and the second light source module have shapes that one is inserted into the other.

11. The vehicle lamp of claim 10, wherein the first light source module comprises a protrusion, and the second light source module comprises a recess into which the protrusion is inserted.

12. The vehicle lamp of claim 1, wherein the at least the first side included in the light source modules overlaps the second side of a neighboring light source module.

13. The vehicle lamp of claim 1, wherein a pair of electrodes is arranged on each side included in the plurality of light source modules, and
wherein the pair of electrodes is connected to p-type electrodes and n-type electrodes of the plurality of semiconductor light emitting devices, respectively.

14. The vehicle lamp of claim 1, wherein at least part of the base portion is bent or curved.

15. The vehicle lamp of claim 1, wherein the first side and second side each has a first electrode and a second electrode of the plurality of electrodes, and
wherein the first electrode and the second electrode are separated from each other without overlap.

16. The vehicle lamp of claim 1, wherein the phosphor layer is formed in the same shape as the plurality of light source modules.

* * * * *